(12) United States Patent
Shibata et al.

(10) Patent No.: US 7,268,392 B2
(45) Date of Patent: Sep. 11, 2007

(54) TRENCH GATE SEMICONDUCTOR DEVICE WITH A REDUCTION IN SWITCHING LOSS

(75) Inventors: Hironobu Shibata, Tokyo (JP); Noboru Matsuda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 327 days.

(21) Appl. No.: 11/062,838

(22) Filed: Feb. 23, 2005

(65) Prior Publication Data

US 2006/0086972 A1    Apr. 27, 2006

(30) Foreign Application Priority Data

Oct. 22, 2004    (JP)    ............................. 2004-308669

(51) Int. Cl.
*H01L 29/94* (2006.01)
*H01L 21/336* (2006.01)

(52) U.S. Cl. ...................... 257/333; 257/389; 257/395; 438/259; 438/270

(58) Field of Classification Search ..................... None
See application file for complete search history.

(56) References Cited

U.S. PATENT DOCUMENTS

| | | | |
|---|---|---|---|
| 4,672,410 A | * | 6/1987 | Miura et al. ................. 257/302 |
| 4,893,160 A | | 1/1990 | Blanchard |
| 5,300,450 A | * | 4/1994 | Shen et al. ................. 438/243 |
| 7,049,657 B2 | * | 5/2006 | Matsuda ...................... 257/333 |
| 7,091,555 B2 | * | 8/2006 | Yoshimochi ................ 257/330 |
| 2001/0001494 A1 | | 5/2001 | Kocon |

FOREIGN PATENT DOCUMENTS

| | | | |
|---|---|---|---|
| JP | 2647884 | | 5/1997 |
| JP | 2000-299464 | | 10/2000 |
| JP | 2001284588 A | * | 10/2001 |
| JP | 2003158268 A | * | 5/2003 |

* cited by examiner

*Primary Examiner*—Alonzo Chambliss
(74) *Attorney, Agent, or Firm*—Oblon, Spivak, McClelland, Maier & Neustadt, P.C.

(57) ABSTRACT

A semiconductor device comprises: a first semiconductor region of a first conductivity type; a second semiconductor region of a second conductivity type provided on the first semiconductor region; a trench formed in the second semiconductor region; a thick gate insulating film selectively provided in a center area of a bottom surface of the trench; a thin gate insulating film provided along a periphery of the bottom surface and on a sidewall of the trench; a third semiconductor region of the first conductivity type that is selectively provided below the thin gate insulating film provided along the periphery of the bottom surface of the trench and that extends to the first semiconductor region; a fourth semiconductor region of the first conductivity type selectively provided in the surface of the second semiconductor region; and a gate electrode filling the trench via the gate insulating film.

12 Claims, 14 Drawing Sheets

TRENCH GATE SEMICONDUCTOR DEVICE WITH A REDUCTION IN SWITCHING LOSS

CROSS-REFERENCE TO RELATED APPLICATIONS

This application is based upon and claims the benefit of priority from the prior Japanese Patent Application No. 2004-308669, filed on Oct. 22, 2004; the entire contents of which are incorporated herein by reference.

BACKGROUND OF THE INVENTION

The invention relates to a semiconductor device and a method of manufacturing the same, and more particularly, to a semiconductor device having a trench gate structure and a method of manufacturing the same.

Semiconductor devices such as trench gate MOSFETs (Metal-Oxide-Semiconductor Field Effect Transistors) and IGBTs (Insulated Gate Bipolar Transistors) are used in various applications including electric power switching. For example, a trench gate MOSFET of a small size is used as a fast switching component having an operating frequency of about 500 kHz for stepping down the supply voltage inside a personal computer (e.g., 17 volts) to a power level for its CPU or various disk drives (e.g., 1.7 volts).

Recent demands for energy saving require these semiconductor devices to have higher efficiency. To this end, it is effective to reduce conduction loss or "on-resistance (Ron)" of the components. To achieve this, reduction of on-resistance has been attempted by downscaling of cells. In particular, significantly high density can be achieved by using a "trench gate structure" for the component structure to gain the channel width.

To improve the operating efficiency of trench gate semiconductor devices, reduction of its switching loss (Qsw) as well as reduction of its "on-resistance" is required. To reduce the switching loss, it is important to reduce "parasite capacitance" of the component to increase its operating rate. The parasite capacitance of the component may include the drain-gate capacitance (Cgd), drain-source capacitance (Cds), and gate-source capacitance (Cgs). Among these capacitance components, reduction of the drain-gate capacitance (Cgd) is particularly effective for reducing the overall capacitance.

In this respect, a structure is disclosed which can decrease Cgd by increasing the thickness of gate oxide film at the bottom of the trench (see, e.g., Japanese Patent No. 2647884).

Figure 23:
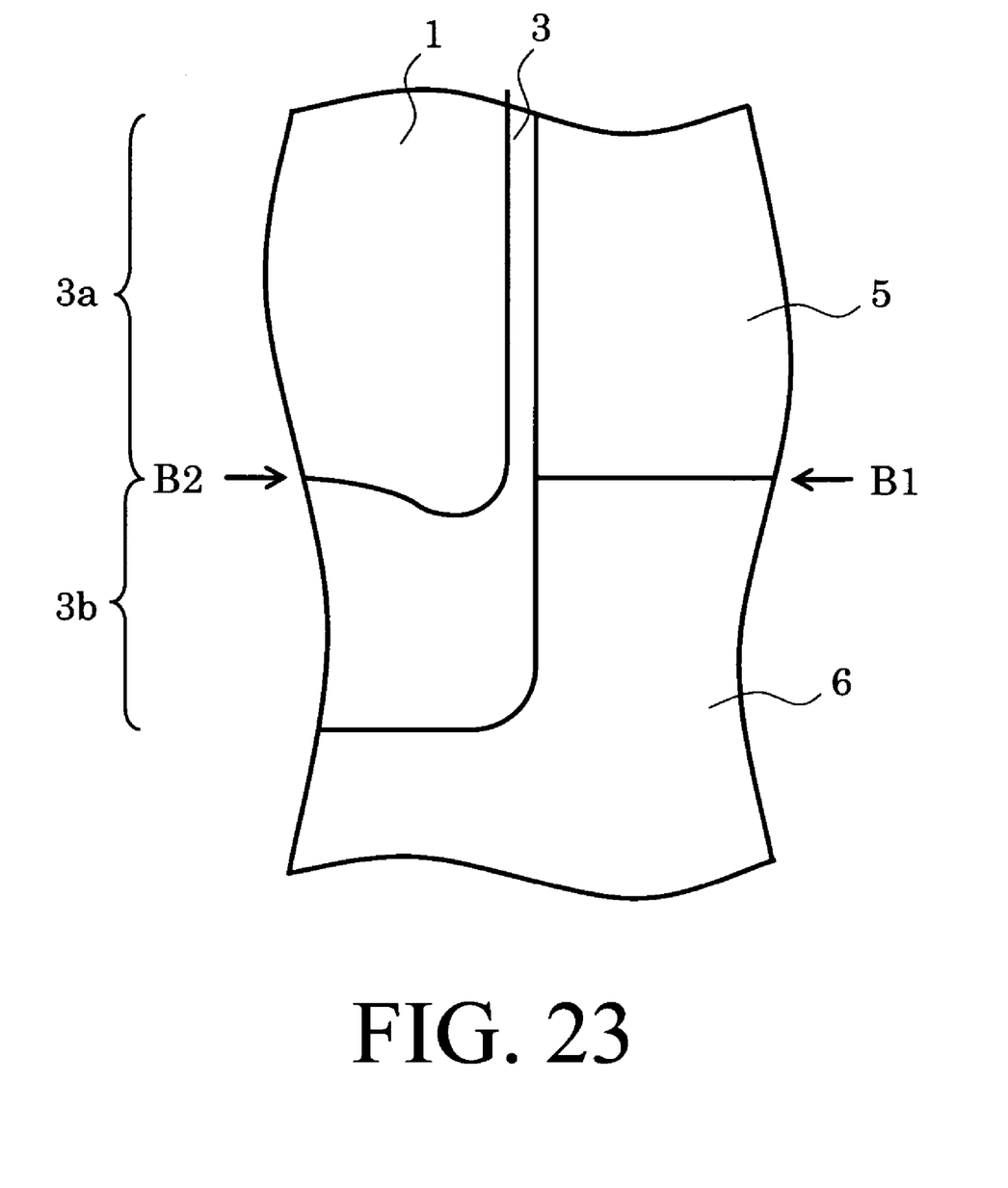
FIG. 23 is a cross-sectional view schematically showing a structure in which the gate oxide film has an increased thickness at the bottom of the trench.

FIG. 23 is a schematic cross-sectional view showing a structure in which the gate oxide film has an increased thickness at the bottom of the trench as described above. More specifically, it has a trench that penetrates a p-type base region 5 and extends to an n-type epitaxial region 6. A gate oxide film 3 is formed on the inner wall of the trench, and a gate electrode 1 fills the remaining space of the trench. The gate oxide film 3 comprises a gate oxide film 3a having smaller film thickness, and a gate oxide film 3b having larger film thickness.

The boundary between the p-type base region 5 and the n-type epitaxial region 6 is denoted by B1, and the boundary between the thin gate oxide film 3a and the thick gate oxide film 3b is denoted by B2. Downward shift of the boundary B1 relative to the boundary B2 leads to insufficient formation of the channel region by the gate voltage, which causes a problem of increased on-resistance (Ron). On the other hand, upward shift of the boundary B1 relative to the boundary B2 causes a problem of increased drain-gate capacitance (Cgd). That is, in this structure, ideally, it is preferred to align the boundary B1 with the boundary B2.

In practice, however, it is very difficult to always align the boundary B1 with the boundary B2. This is because the p-type base region 5 is formed by diffusion of p-type impurities into the surface of the epitaxial layer, which causes certain variations in its formation depth. On the other hand, certain variations for the depth of the trench are also unavoidable because the depth is controlled by the process time for etching such as RIE (reactive ion etching).

It is therefore difficult to reproducibly achieve an ideal positional relationship of aligned boundaries B1 and B2 irrespective of whether the top of the trench (or the surface of the base region 5) or the bottom of the trench is taken as a reference. For this reason, according to the conventional art, it has been difficult to stably obtain a structure of a trench gate semiconductor device in which low on-resistance (Ron) and low switching loss (Qsw) are simultaneously achieved.

SUMMARY OF THE INVENTION

According to an aspect of the invention, there is provided a semiconductor device comprising: a first semiconductor region of a first conductivity type; a second semiconductor region of a second conductivity type provided on the first semiconductor region; a trench formed in the second semiconductor region; a thick gate insulating film selectively provided in a center area of a bottom surface of the trench; a thin gate insulating film provided along a periphery of the bottom surface and on a sidewall of the trench; a third semiconductor region of the first conductivity type that is selectively provided below the thin gate insulating film provided along the periphery of the bottom surface of the trench and that extends to the first semiconductor region; a fourth semiconductor region of the first conductivity type selectively provided in the surface of the second semiconductor region; and a gate electrode filling the trench via the gate insulating film.

According to other aspect of the invention, there is provided a method of manufacturing a semiconductor device comprising: forming a first semiconductor region of a first conductivity type, a second semiconductor region of a second conductivity type provided thereon, and a trench formed in the second semiconductor region, the trench having a thick oxide film selectively formed in a center area of a bottom surface of the trench and a thin oxide film formed along a periphery of the bottom surface and on a sidewall of the trench; forming a third semiconductor region of the first conductivity type extending to the first semiconductor region below the thin oxide film formed along the periphery of the bottom surface of the trench by doping impurities of the first conductivity type generally in a vertical direction with respect to the bottom surface of the trench using the thick oxide film as a mask; and filling the trench with a gate electrode.

DETAILED DESCRIPTION

Embodiments of the invention will now be described with reference to the drawings.

Figure 1:
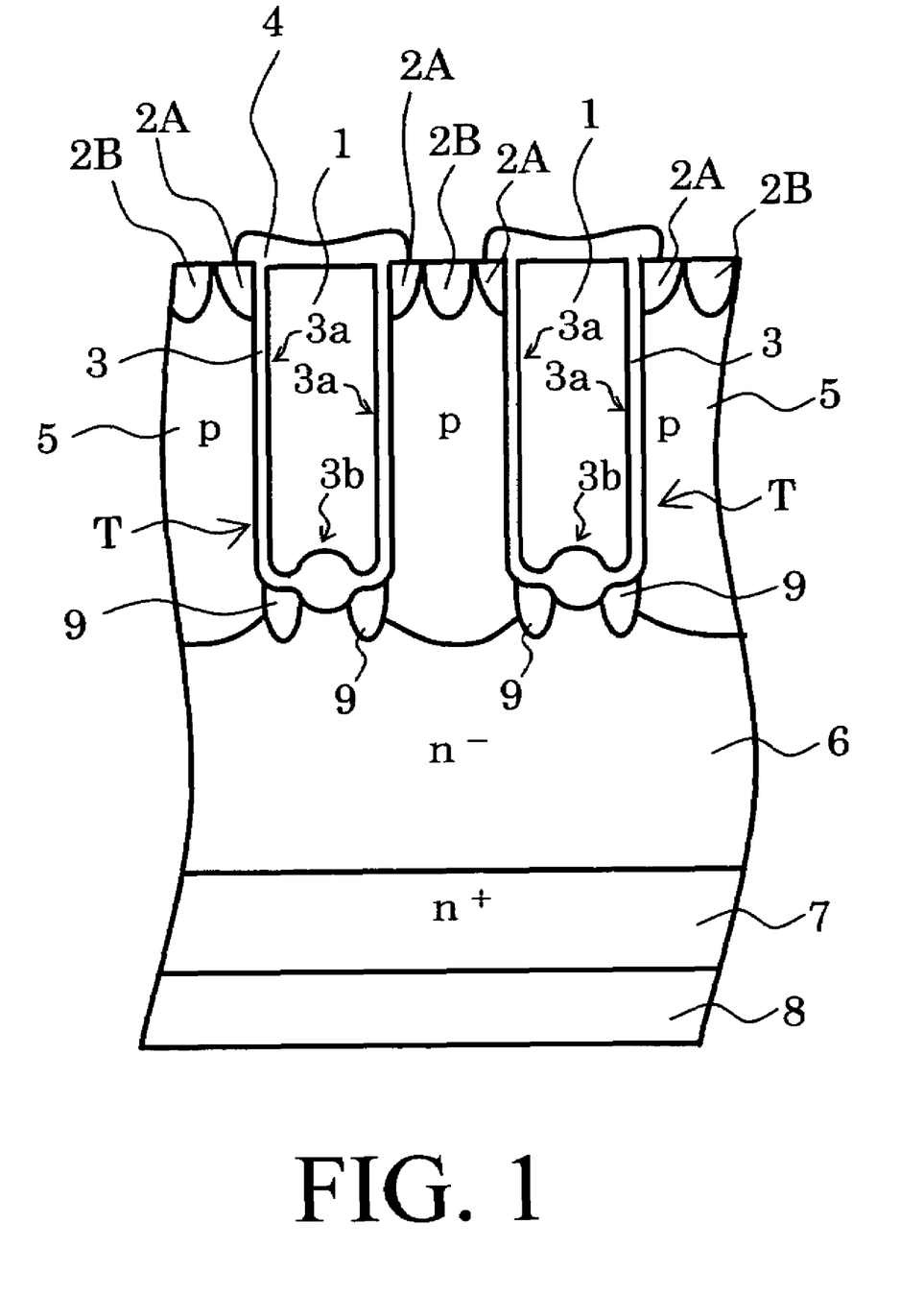
FIG. 1 is a schematic view illustrating a cross-sectional structure of a semiconductor device according to a first embodiment of the invention.

FIG. 1 is a schematic view illustrating a cross-sectional structure of a semiconductor device according to a first embodiment of the invention. More specifically, this figure shows a cross-sectional structure of a relevant part in the vicinity of the gate of a trench gate n-channel MOSFET.

Figure 2:
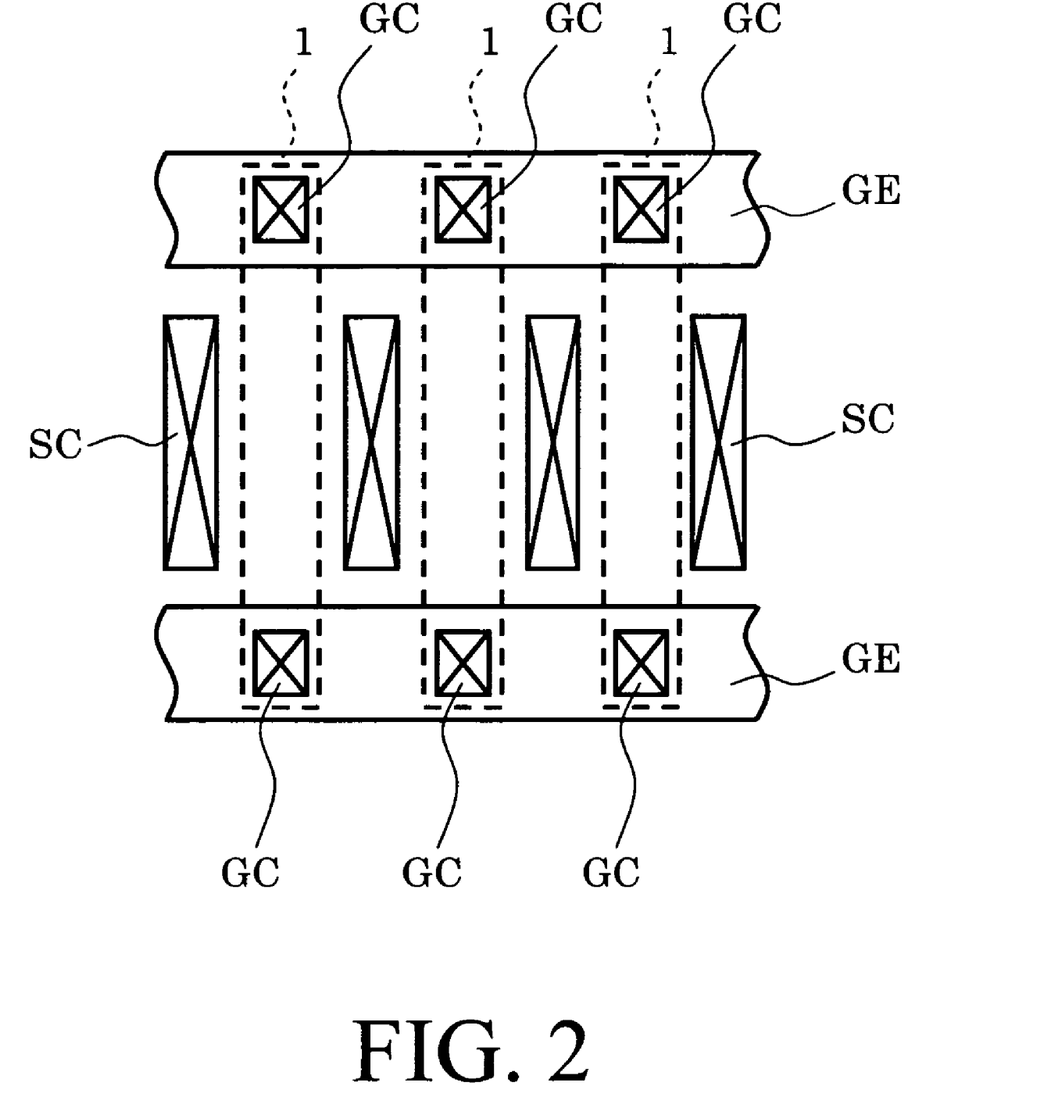
FIG. 2 is a schematic view illustrating a planar structure of a MOSFET of the first embodiment.

FIG. 2 is a perspective plan view illustrating the electrode structure of this semiconductor device.

More specifically, an $n^-$-type epitaxial region 6 and a p-type base region 5 are stacked in this order on an $n^+$-type substrate 7. From the surface thereof, trenches T are formed, extending to the epitaxial region 6. The trench T contains a buried gate composed of a gate oxide film 3 and a buried gate electrode 1. An interlayer insulating film 4 is provided as appropriate on the buried gate. An n-type source region 2A and a $p^+$-type source region 2B are formed around the top of the trench T. A drain electrode 8 is provided as appropriate on the rear side of the substrate 7.

The planar structure of this MOSFET is now described with reference to FIG. 2. A plurality of buried gate electrodes 1 formed parallel to each other in FIG. 1 are linked together by a gate electrode portion GE that is formed generally orthogonal to these buried gate electrodes 1. This is connected in turn to a gate interconnect (not shown) by gate contacts GC for the gate electrode portion GE. In addition, the source regions 2A and 2B are connected to a source interconnect (not shown) by source contacts SC via the interlayer insulating film (not shown). The gate interconnect is insulated from the source interconnect by the interlayer insulating film (not shown).

In this embodiment, the gate oxide film 3 comprises a gate oxide film 3a having smaller film thickness, and a gate oxide film 3b having larger film thickness. The thick gate oxide film 3b is selectively provided in a center area of the bottom of the trench T. N-type regions 9 are selectively provided below the thin gate oxide film 3a at the bottom of the trench T. The n-type epitaxial region 6 adjacently underlies the thick gate oxide film 3b. The boundary between the p-type base region 5 and the n-type epitaxial region 6 is located in contact with the n-type region 9.

According to this embodiment, the thick gate oxide film 3b and the n-type region 9 are selectively provided as described above. The gate-drain parasite capacitance can thus be reduced while the on-resistance can be stably kept low. This point will be described in detail below.

Figure 3:
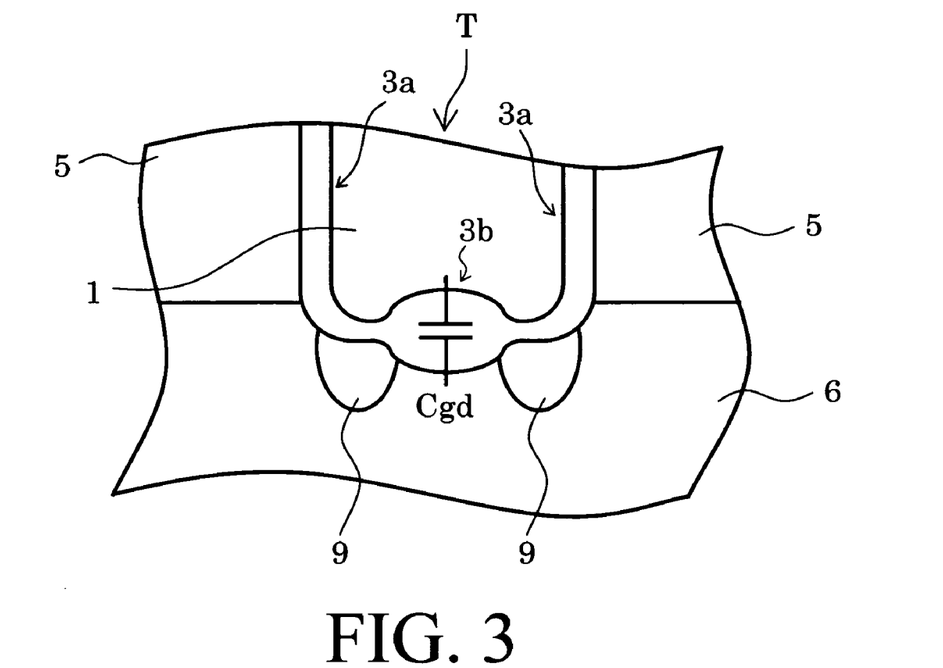
FIGS. 3 to 5 are partial enlarged cross-sectional views showing the neighborhood of the trench bottom of a MOSFET of the embodiment of the invention.
Figure 4:
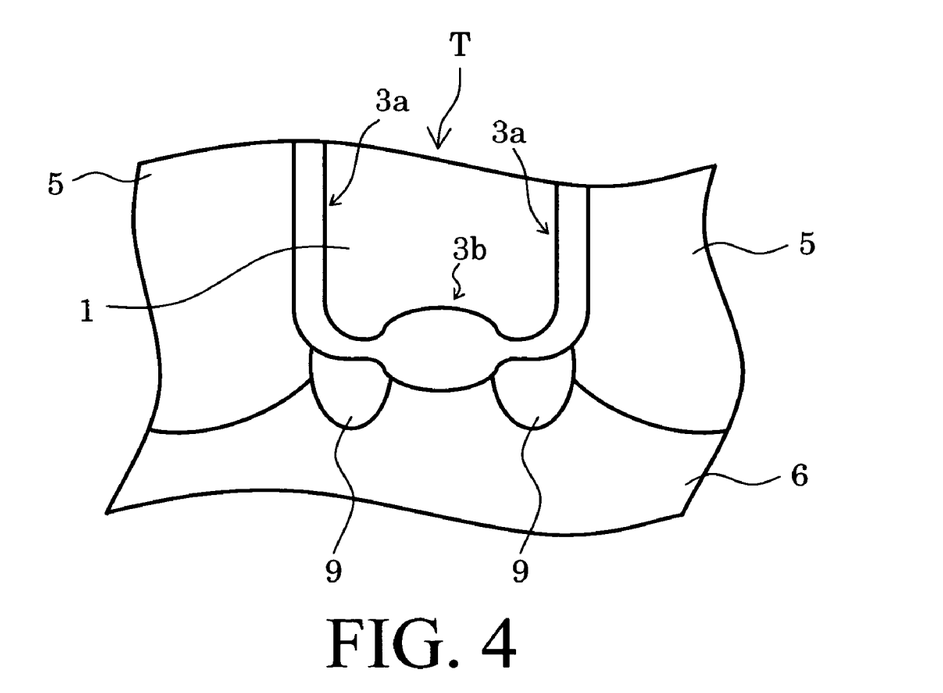
Figure 5:
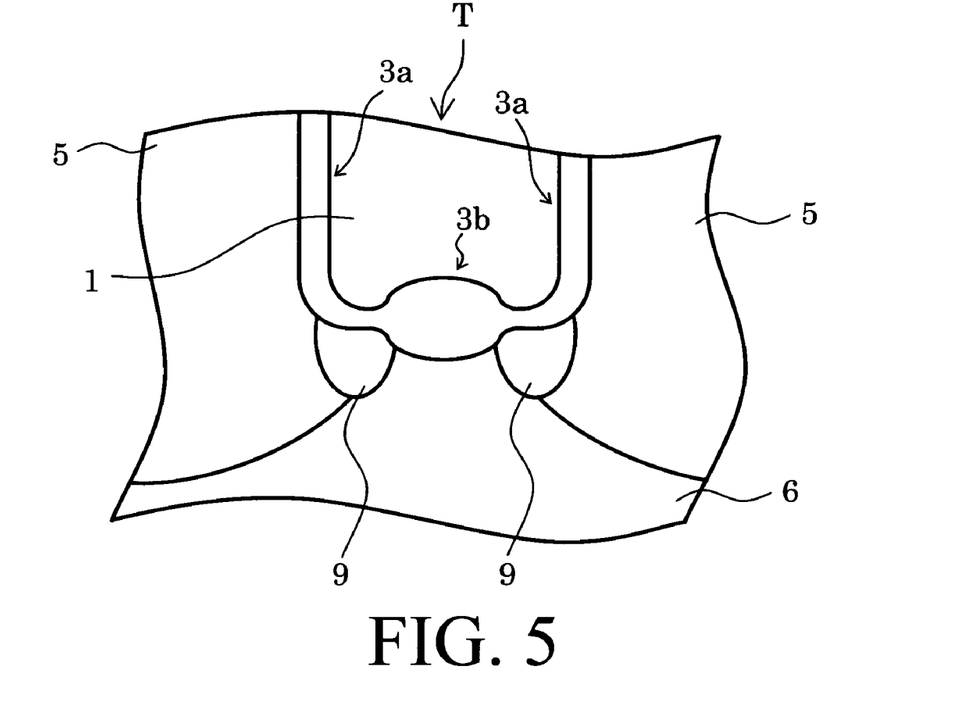

FIGS. 3 to 5 are partial enlarged cross-sectional views showing the neighborhood of the trench bottom of a MOSFET of this embodiment.

First, according to this embodiment, as shown in FIGS. 3 to 5, the thick gate oxide film 3b is selectively provided in a center area of the bottom of the trench T, and the n-type epitaxial region 6 is adjacently provided under the thick gate oxide film 3b. The gate-drain parasite capacitance Cgd can thus be reduced.

In addition, according to this embodiment, the n-type regions 9 are selectively provided below the thin gate oxide film 3a at the bottom of the trench T. This avoids increase of on-resistance even under variations of the depth of the p-type base region 5.

More specifically, as described in detail later, the p-type base region 5 is formed by doping p-type impurities into the surface of the n-type epitaxial layer 6. Therefore, in actual manufacturing of the MOSFET, the depth of the p-type base region 5 is varied depending on variations of the diffusion condition and the depth of the trench T.

For example, as illustrated in FIG. 3, when the boundary between the p-type base region 5 and the n-type epitaxial region 6 is in contact with the thin gate oxide film 3a, an inversion channel is formed by application of a predetermined voltage to the gate electrode 1 and the on-state occurs. That is, no increase of on-resistance is involved.

However, when the p-type base region 5 is formed more deeply, the on-resistance will increase without n-type regions 9.

Figure 6:
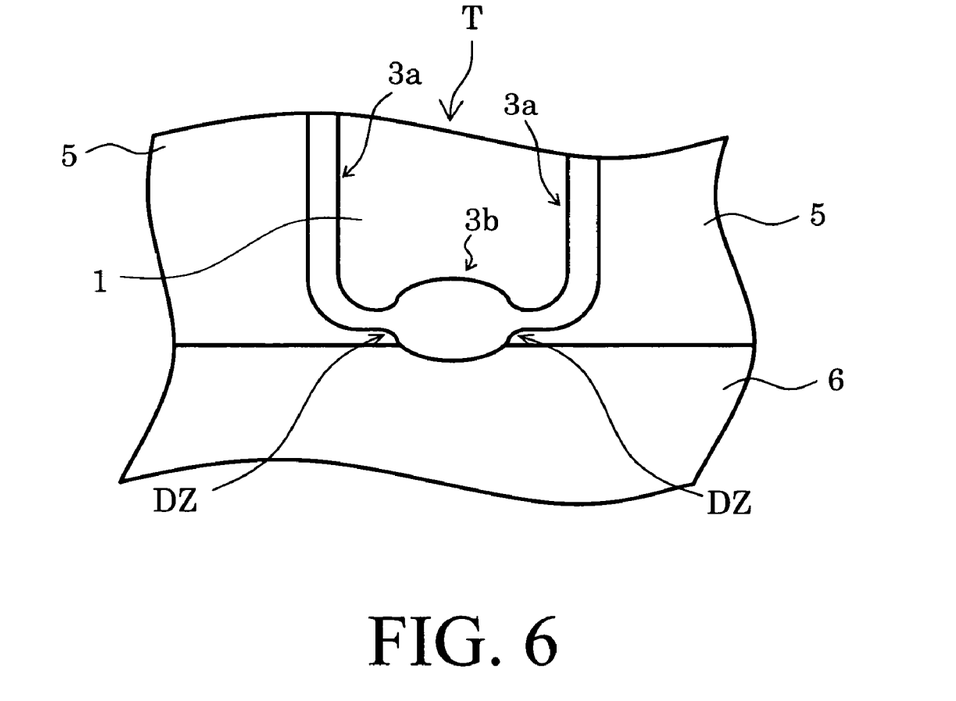
FIGS. 6 and 7 are partial enlarged cross-sectional views of a MOSFET of a comparative example without n-type regions 9.
Figure 7:
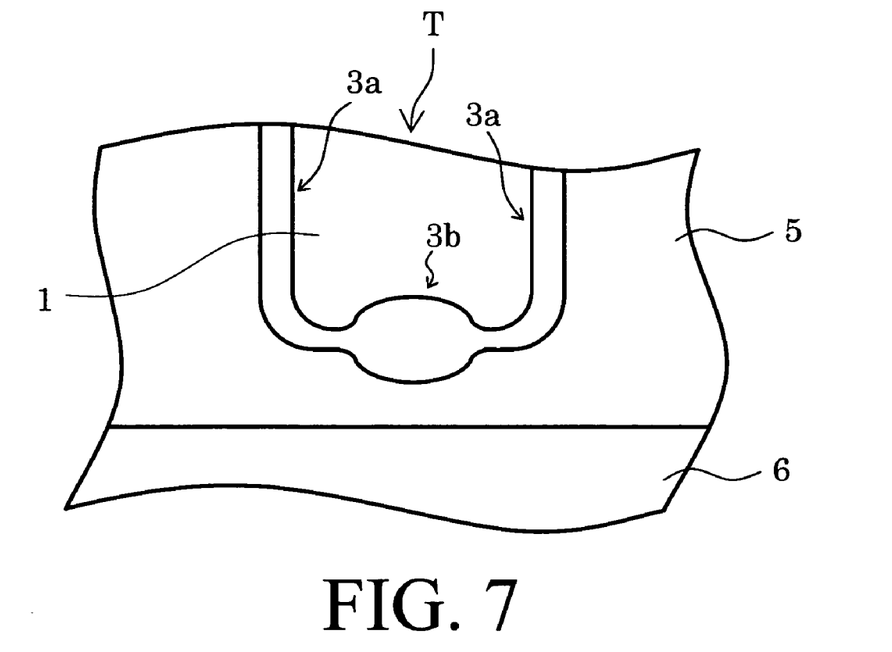

FIGS. 6 and 7 are partial enlarged cross-sectional views of a MOSFET of a comparative example without n-type regions 9.

More specifically, without n-type regions 9, and with the deeply formed p-type base region 5 as shown in FIG. 6, electric field is not sufficiently applied to the portion DZ in contact with the thick gate oxide film 3b even when the gate voltage is turned on. That is, formation of an inversion channel is obstructed, which results in increase of on-resistance.

Furthermore, as shown in FIG. 7, when the p-type base region 5 is formed even more deeply due to variations of the process condition, the depth surpasses the trench T. Thus the inversion channel cannot be connected with the n-type epitaxial region 6, or drain. That is, the on-state may be impossible.

In contrast, according to this embodiment, with the n-type regions 9 as shown in FIGS. 4 and 5, the p-type base region 5 will not be in contact with the thick gate oxide film 3b even under variations of the depth of the p-type base region 5. Furthermore, even for the p-type base region 5 formed very deeply due to considerable variations of the process condition, a current path is ensured via the inversion channel if the p-type base region 5 is in contact with the n-type region 9.

In addition, as shown in FIG. 3, when the lower surface of the base region 5 is shifted upward relative to the bottom surface of the trench T, the drain-gate capacitance (Cgd) tends to increase as described above with reference to FIG. 23. It is therefore preferred in this embodiment that the lower surface of the base region 5 is at a deeper level below the thin gate oxide film 3a formed at the bottom surface of the trench T, and is in contact with the n-type regions 9.

As described above, according to this embodiment, a thick gate oxide film 3b is selectively provided in a center area of the bottom of the trench T. N-type regions 9 are selectively provided below thin gate oxide films 3 on both sides of the thick gate oxide film 3b. This can suppress the increase of on-resistance (Ron) and definitely reduce gate-drain parasite capacitance Cgd even under variations of the manufacturing process condition. This enables stable manufacturing of a switching component that can achieve high switching efficiency.

Carrier concentration for each region is now described. The concentration for the p-type base region 5 is generally $1\times10^{15}$ to $2\times10^{17}/cm^3$. The concentration for the n—type epitaxial region 6 is generally on the order of $10^{15}/cm^3$. On the other hand, the concentration for the n-type region 9 can be generally about $2\times10^{15}$ to $5\times10^{17}/cm^3$. That is, as described in detail later, the n-type region 9 can be formed by doping n-type impurities into the p-type base region 5. It is therefore preferred that the concentration for the n-type region 9 is slightly higher than that for the base region 5.

Figure 8:
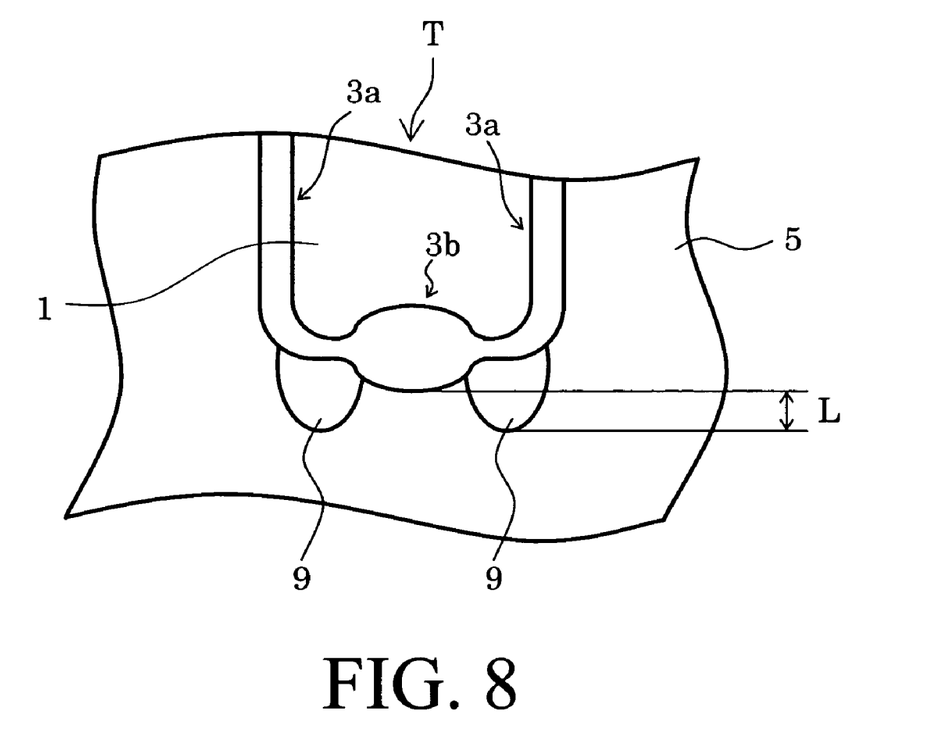
FIGS. 8 and 9 are partial enlarged cross-sectional views showing the neighborhood of the trench bottom of a MOSFET of the embodiment of the invention.

With respect to the depth of the n-type region 9, as shown in FIG. 8, it is preferred that the distance L from the lower end of the thick gate oxide film 3b to the lower end of the n-type region 9 is generally zero micrometer or more. The distance L is set to zero micrometer or more because the boundary between the base region 5 and the n-type epitaxial region 6 may not be in contact with the n-type region 9 if the lower end of the n-type region 9 is shallower relative to the lower end of the thick gate oxide film 3b. On the other hand, when the n-type region 9 is formed more deeply, no problem occurs when the depth of the base region 5 is significantly varied.

Figure 9:
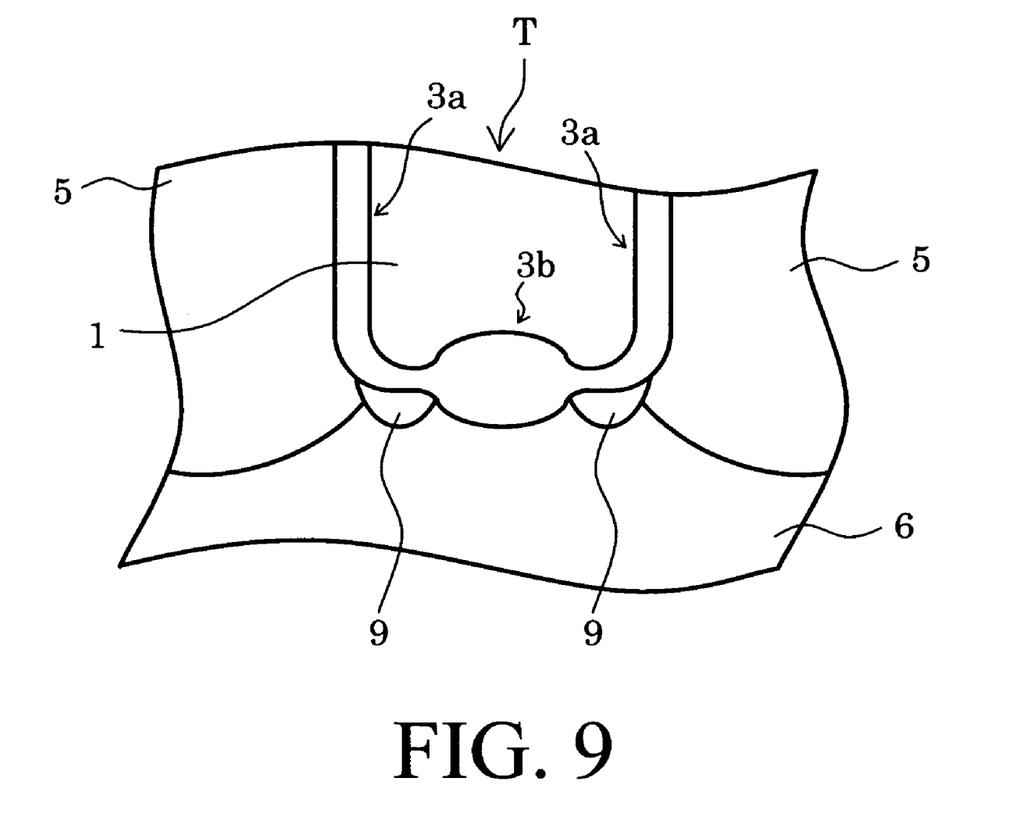

Therefore, in this embodiment, as illustrated in FIG. 9, the lower end of the n-type region 9 may be generally at the same level as that of the thick gate oxide film 3b.

In addition, in this embodiment, part of the p-type base region 5 may remain below the thick gate oxide film 3b.

Figure 10:
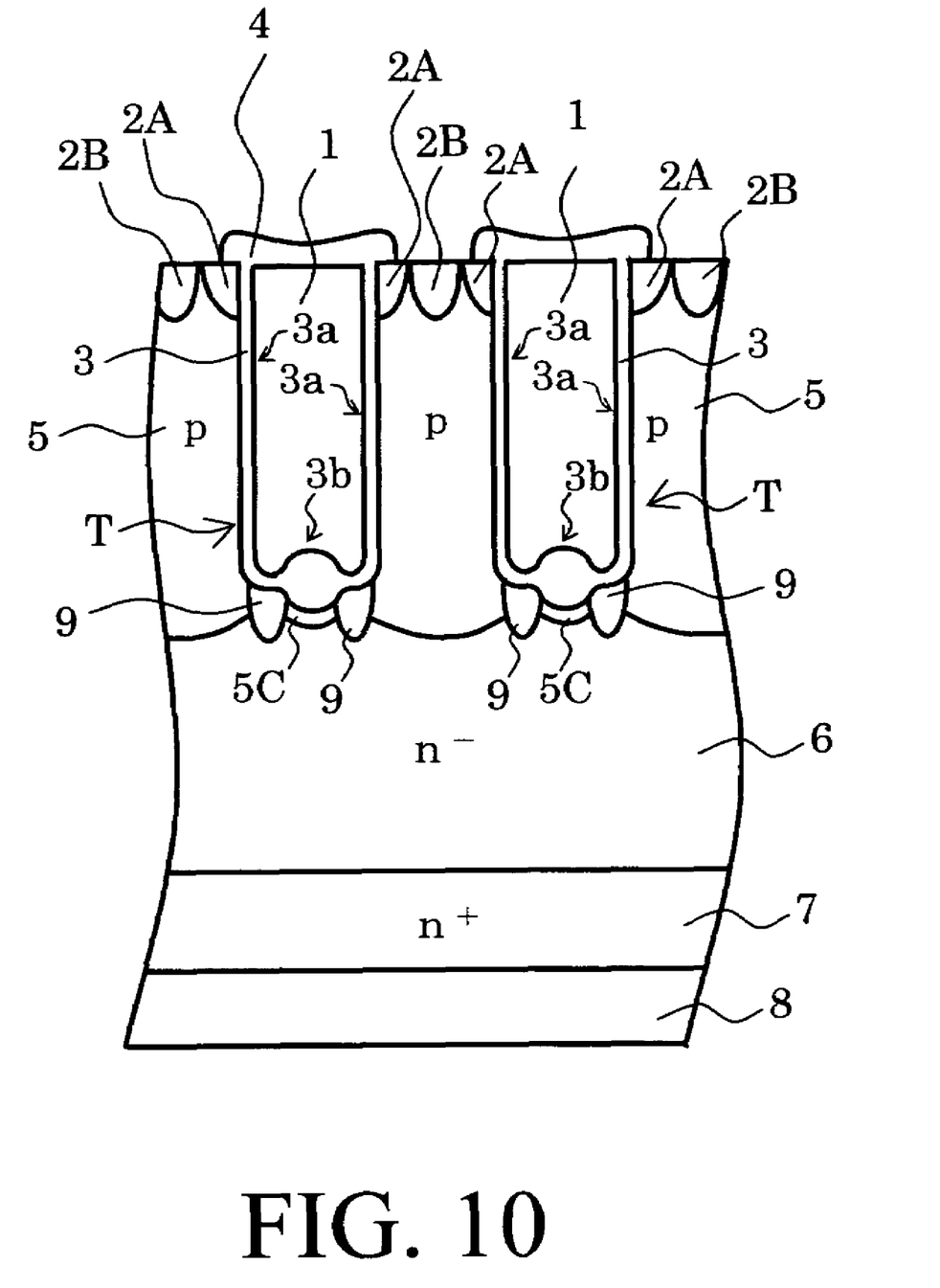
FIG. 10 is a schematic view illustrating a cross-sectional structure of a semiconductor device according to a variation of the embodiment of the invention.

FIG. 10 is a schematic cross-sectional view showing a semiconductor device according to a variation of this embodiment.

More specifically, in this variation, a partial region 5C of the p-type base region 5 remains below the thick gate oxide film 3b. The region 5C is surrounded by the n-type region 9, and thus isolated from the source electrode.

This variation also achieves the effect described above with reference to FIGS. 3 to 5. In addition, in this variation, since the p-type region 5C underlying the thick gate oxide film 3b has a relatively low impurity concentration, the gate-drain parasite capacitance Cgd can be advantageously kept low.

A method of manufacturing the semiconductor device of this embodiment will now be described.

FIGS. 11 to 22 are process cross-sectional views illustrating a relevant part of a method of manufacturing a semiconductor device of this embodiment.

Figure 11:
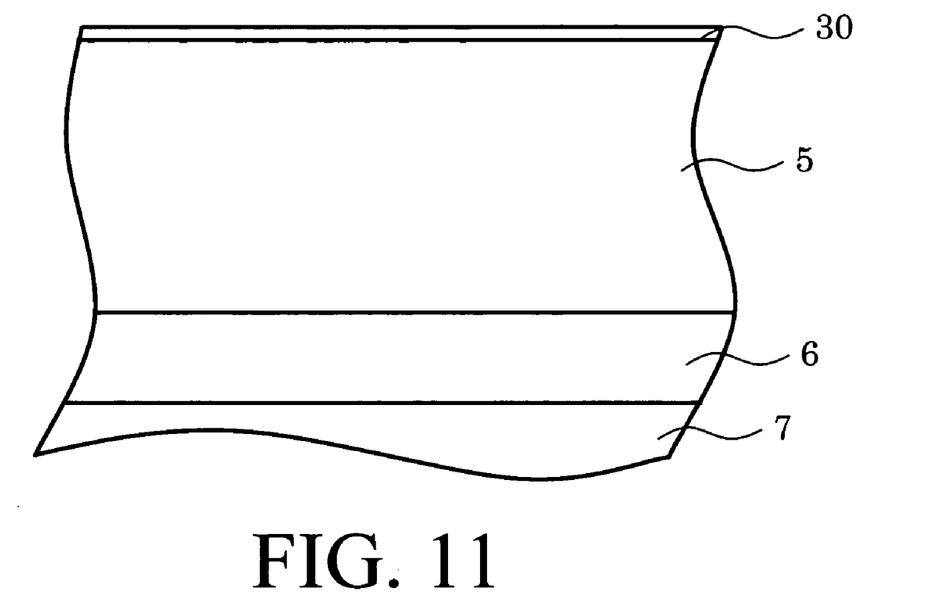
FIGS. 11 to 22 are process cross-sectional views illustrating a relevant part of a method of manufacturing a semiconductor device of the embodiment of the invention.

First, as shown in FIG. 11, p-type impurities are diffused into the surface of an n⁻-type epitaxial region 6 formed on a semiconductor substrate 7 to form a p-type base region 5. A mask layer 30 composed of $SiO_2$ is then formed by CVD (chemical vapor deposition) or other method.

Figure 12:
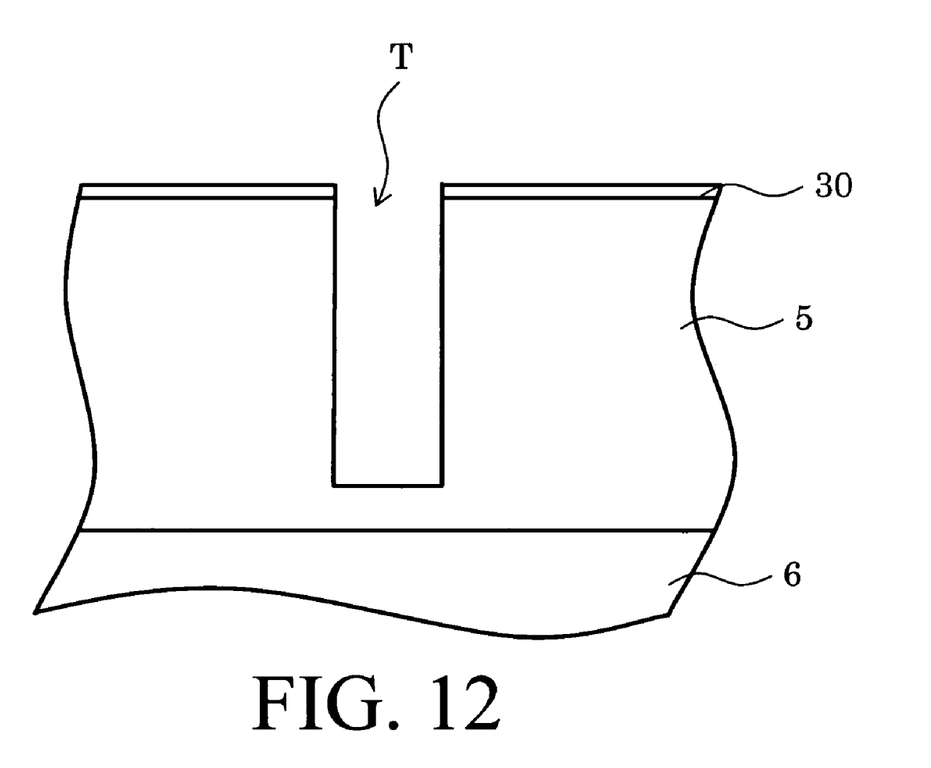

Next, as shown in FIG. 12, the mask layer 30 is patterned to form an opening. The semiconductor layer exposed in this opening is etched to form a trench T. At this time, preferably, the trench T is formed so that it does not extend to the n-type epitaxial region 6 but is terminated in the base region 5. The trench T may have a depth of, for example, 0.5 to 1 micrometer, and a width (lateral width in FIG. 12) of, for example, about 0.1 to 0.5 micrometer.

Figure 13:
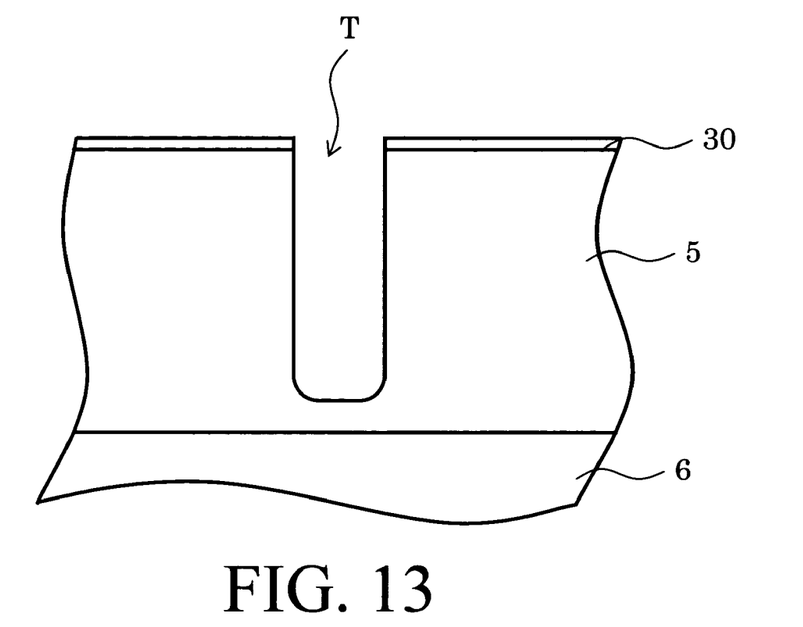

Next, sacrificial oxidation and isotropic etching are applied to the inner wall of the trench T. Thus, as shown in FIG. 13, the inner wall surface of the trench is planarized, and the corners at the bottom are chamfered to a curved shape.

Figure 14:
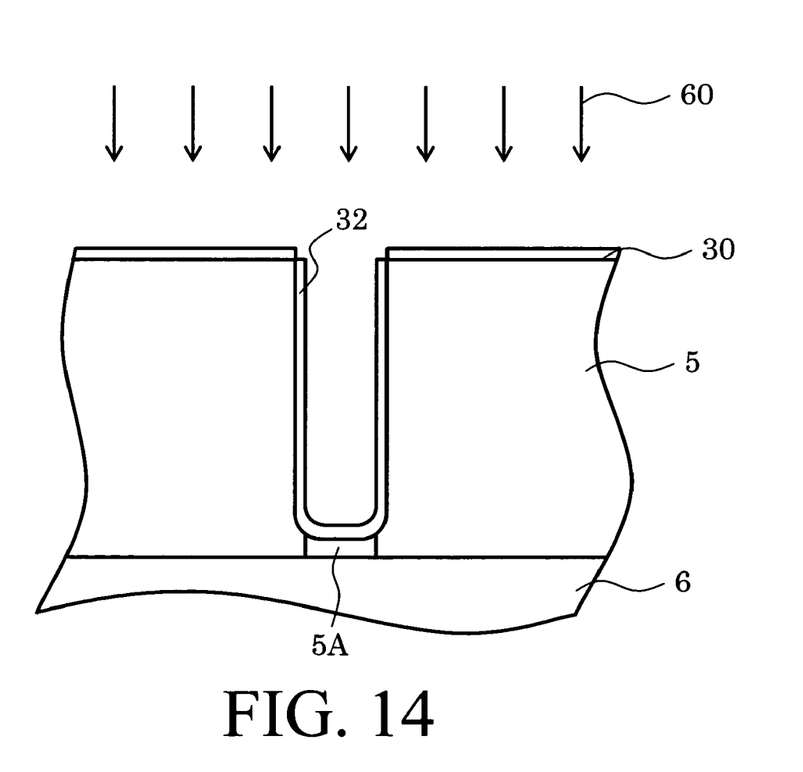

Next, as shown in FIG. 14, a thin thermal oxide film 32 having a thickness of about 20 to 30 nanometers is formed on the inner wall of the trench T. Ion implantation of n-type impurities 60 is performed across the thermal oxide film 32. At this time, the injection angle of the n-type impurities 60 is generally vertical to the major surface of the substrate so that the sidewall of the trench T may not be doped with the n-type impurities 60. Arsenic (As), for example, may be used for the n-type impurities 60. The acceleration voltage may be 70 kiloelectronvolts (keV), for example, and the dose amount may be about $1\times10^{12}/cm^2$ or more.

This ion implantation results in a region 5A doped with n-type impurities below the bottom of the trench T. When the region 5A is doped with n-type impurities to have a higher impurity concentration than the n-type epitaxial region 6, the p-type base region 5 can be definitely inversed to the n-type. The n-type impurities doped in this ion implantation may also be used for part of the n-type source region 2A formed in the surface of the p-type base region 5.

Figure 15:
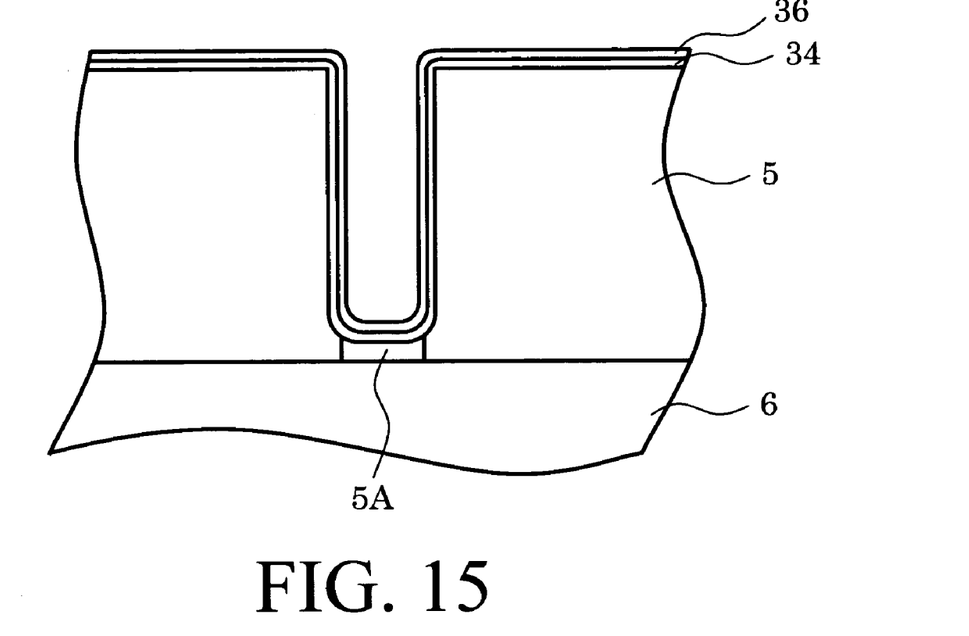

Next, the mask layer 30 and the thin thermal oxide film 32 are removed. Then, as shown in FIG. 15, a thin thermal oxide film 34 having a thickness of about 20 to 30 nanometers is formed. Furthermore, a silicon nitride film 36 is formed thereon.

Figure 16:
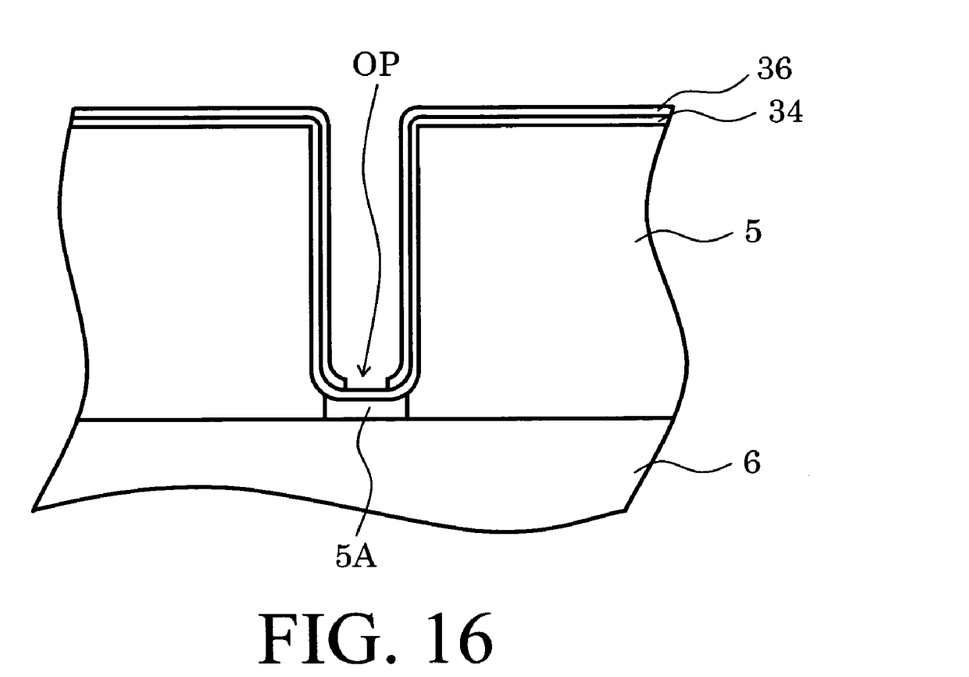

Subsequently, as shown in FIG. 16, the silicon nitride film 36 is selectively removed in a center area of the bottom of the trench T to form an opening OP.

Figure 17:
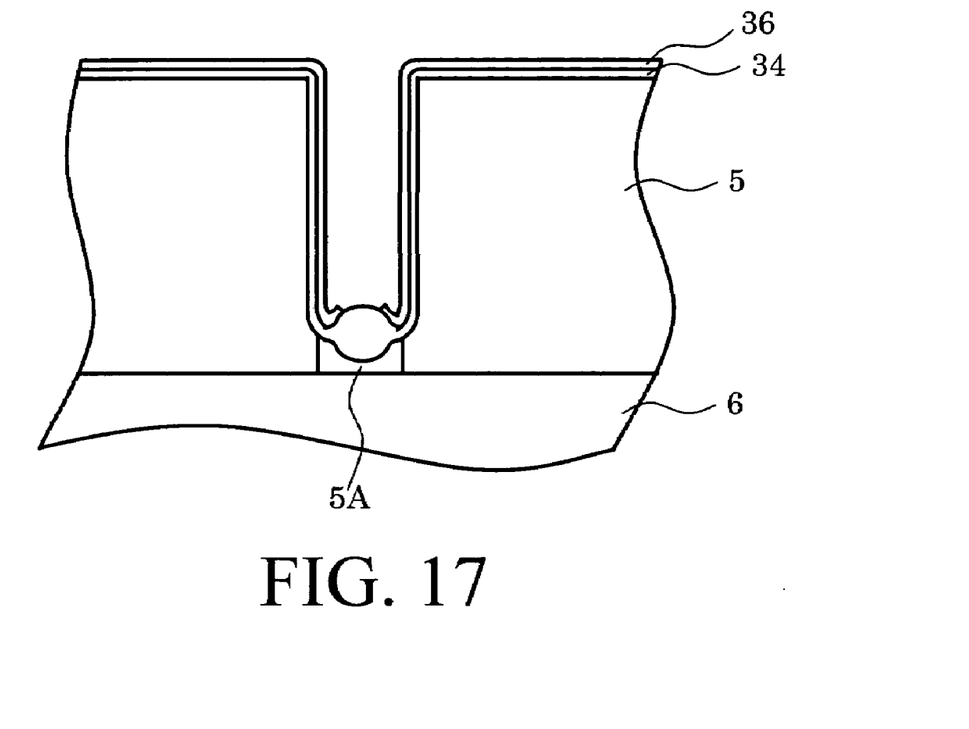

Next, oxidation of the portion exposed in the opening OP is advanced to form a thick oxide film as shown in FIG. 17. This oxidation may be performed, for example, by hydrogen combustion oxidation at 950° C. for several hours. The silicon layer underlying the opening OP is oxidized to form a thick oxide film.

Alternatively, a silicon oxide film may be deposited in such a surface selective manner that it is not deposited on the silicon nitride film 36. Such a deposition method may include, for example, atmospheric CVD method using concentrated ozone and TEOS (tetraethyl orthosilicate) as raw material gas.

Figure 18:
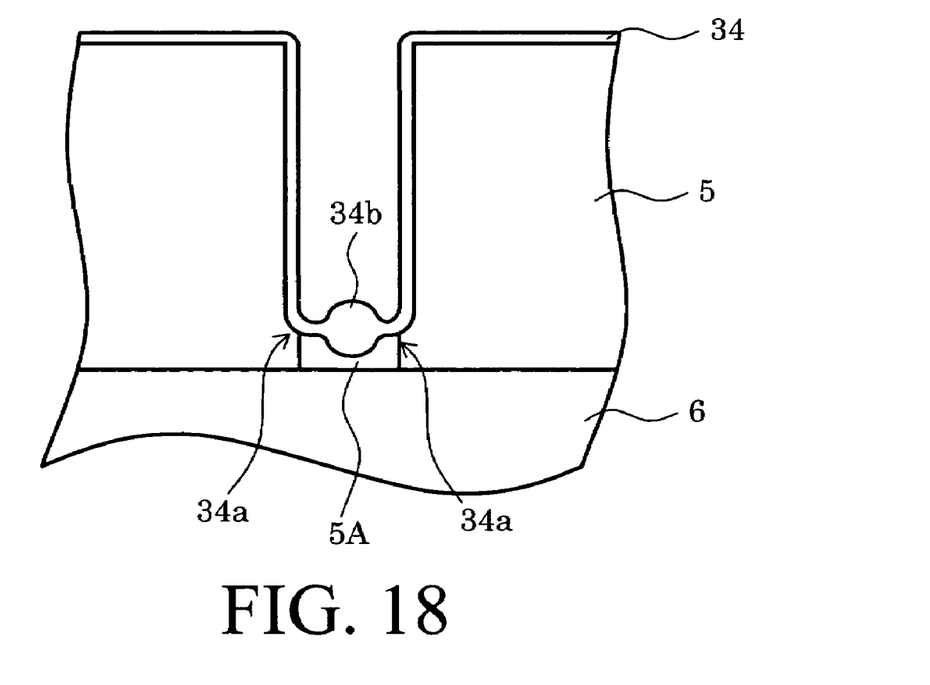

Subsequently, as shown in FIG. 18, the silicon nitride film 36 is removed. Selective etching of the silicon nitride film 36 may be performed by phosphoric acid etching or CDE (chemical dry etching), for example. At this point, a thermal oxide film 34a that remains thin and a thick silicon oxide film 34b formed by advanced oxidation have been formed.

Figure 19:
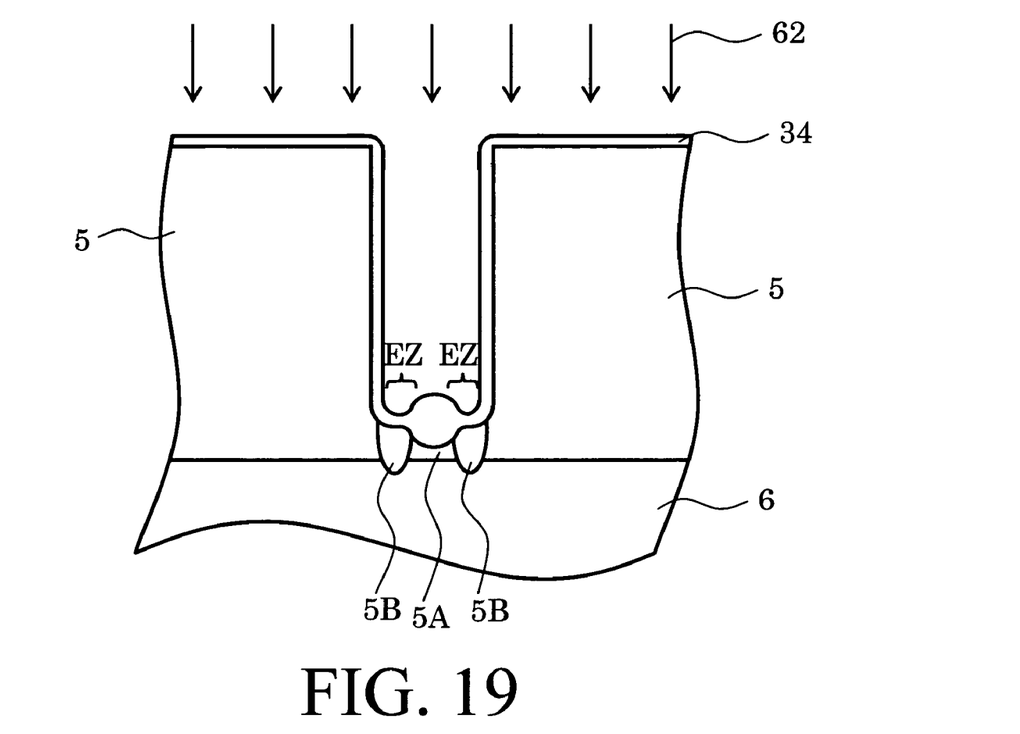

Subsequently, as shown in FIG. 19, n-type impurities 62 are ion implanted. At this time again, the injection angle of the n-type impurities 62 is generally vertical to the major surface of the substrate so that the sidewall of the trench T may not be doped with the n-type impurities 62. The n-type impurities 62 are passed through the thin thermal oxide film 34a that remains in the region EZ of the trench bottom and implanted into the p-type base region 5 (region 5A) to form a region 5B doped with n-type impurities. At this time, the region 5B can be formed so as to reach the n-type epitaxial region 6 beyond the p-type base region 5 by appropriately adjusting the depth of the trench T and the ion implantation condition.

The n-type impurities doped in this ion implantation may also be used for part or all of the impurities for the n-type source region 2A formed in the surface of the p-type base region 5. Arsenic (As), for example, may be used for the n-type impurities 62. The acceleration voltage may be 90 kiloelectronvolts (keV), for example, and the dose amount may be about $1\times10^{12}/cm^2$ or more.

Figure 20:
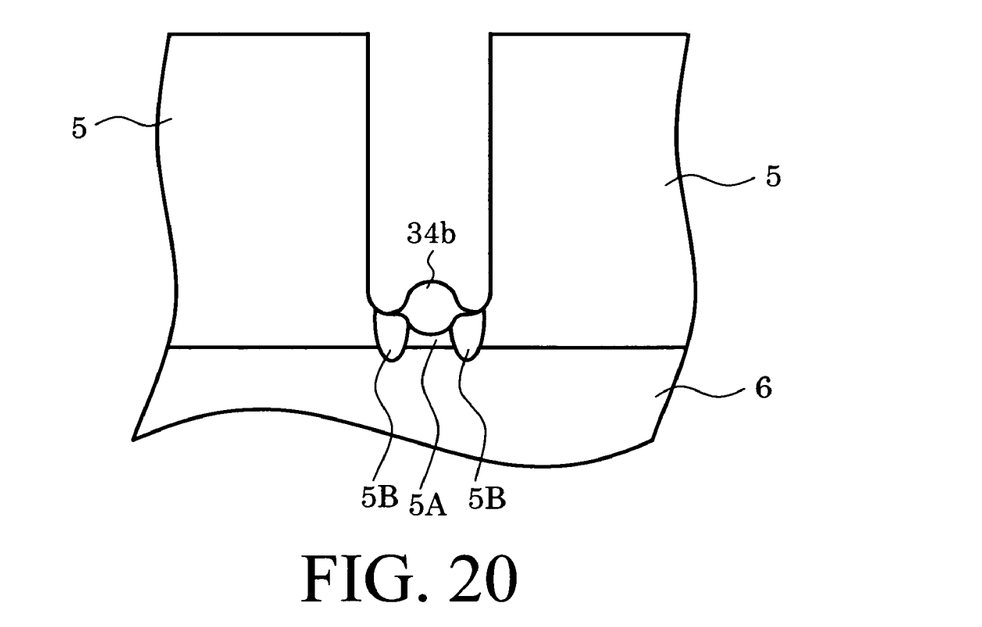

Subsequently, the thin thermal oxide film 34 is removed as shown in FIG. 20.

Furthermore, the inner wall of the trench T is thermally oxidized to form a gate oxide film 3, and the remaining space of the trench T is filled with a gate electrode 1. The thin gate oxide film 3a may have a thickness of about 50 nanometers, for example. Polysilicon (polycrystalline silicon), for example, may be used for the gate electrode 1.

Figure 21:
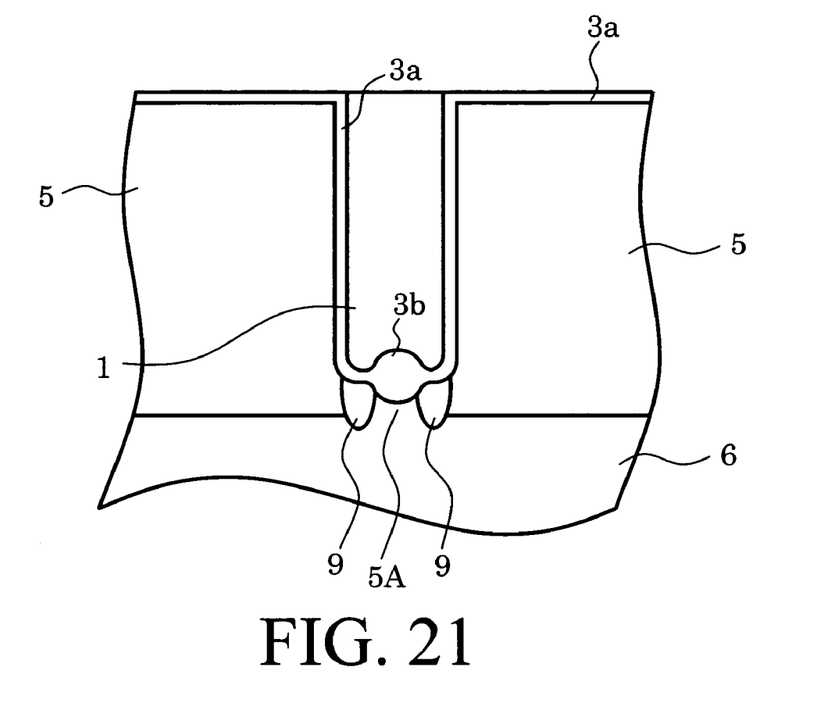

Furthermore, an n-type source region and a p-type source region, not shown, are formed as appropriate in the surface of the p-type base region 5, and heat treatment is applied for activating the ion-implanted impurities. The n-type impurities implanted in the regions 5A and 5B are then activated, and the relevant part of the semiconductor device of this embodiment is completed as shown in FIG. 21.

According to the foregoing manufacturing method of this embodiment, as described above with reference to FIG. 19, the n-type region 9 can be formed in a self-aligned manner by doping the trench bottom with n-type impurities using the thick oxide film 3b as a mask. In a structure obtained in this manner, as described above with reference to FIGS. 3 to 5, increase of on-resistance can be suppressed even under variations of the depth of the p-type base region 5 relative to the bottom of the trench T. That is, the increase of on-resistance (Ron) can be suppressed and the gate-drain capacitance (Cgd) can be definitely reduced even under variations of diffusion for forming the base region or variations of the depth of the trench T. As a result, the switching loss (Qsw) can be reduced.

It should be noted that in this embodiment, the ion implantation step described above with reference to FIG. 14 may be omitted. That is, n-type impurities may not be ion implanted below the thick gate oxide film 3b.

Figure 22:
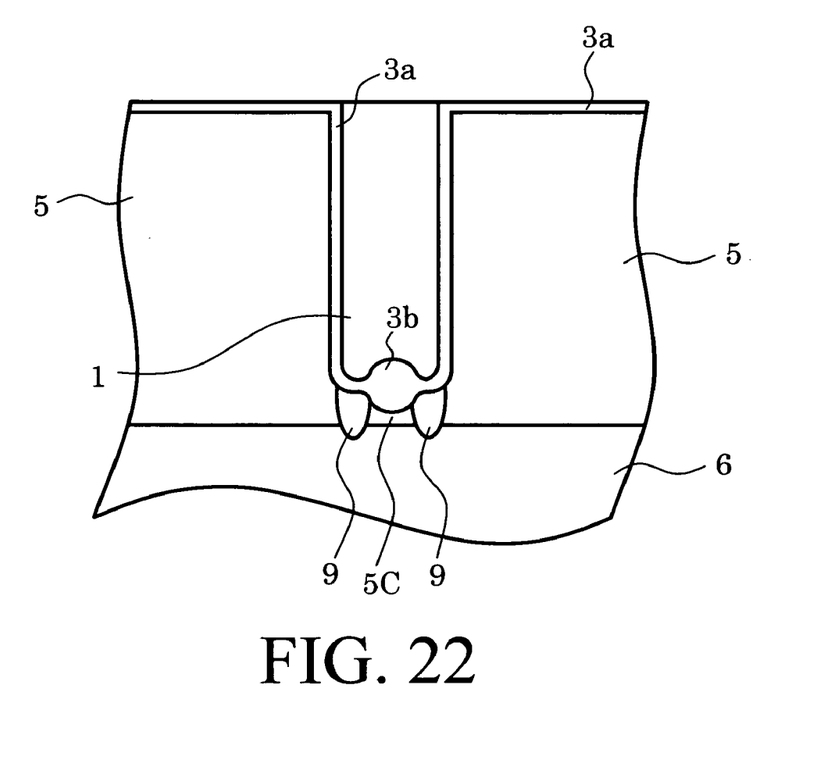

In this case, as illustrated in FIG. 22, a thin p-type region 5C remains below the thick gate oxide film 3b. In this way, the semiconductor device described above with reference to FIG. 10 is obtained.

On the other hand, when the lower end of the thick gate oxide film 3b reaches the n⁻-type epitaxial region 6, the portion under the thick gate oxide film 3b is an n⁻-type region.

In any of these cases, advantageously, the gate-drain capacitance (Cgd) can be reduced.

In the manufacturing method illustrated in FIGS. 11 to 22, the p-type base region 5 is formed first, followed by formation of the trench T and the n-type region 9. However, the present invention is not limited thereto. For example, it is possible to form first a trench T in the n-type epitaxial region 6, followed by forming an insulating film 34 and the like thereon, and subsequently to form a p-type base region 5 by doping p-type impurities into the surface. In this case again, increase of on-resistance (Ron) can be suppressed even under variations of the depth of the trench T or variations of diffusion for forming the p-type base region 5.

The embodiment of the invention has been described with reference to specific examples. However, the invention is not limited to these specific examples.

For example, the invention can be applied to various semiconductor devices having so-called "trench gates" to achieve similar advantageous effects, which are also encompassed within the scope of the invention. Such semiconductor devices may include IGBTs (insulated gate bipolar transistors), for example.

Any appropriate modification by those skilled in the art with respect to material, conductivity type, carrier concentration, impurities, thickness, and positional relationship of various elements of the semiconductor device described above is also encompassed within the scope of the invention as long as it comprises the feature of the invention.

Any other configuration of the above-described semiconductor device and the manufacturing method thereof that is selected as appropriate by those skilled in the art from among known configurations is also encompassed within the scope of the invention as long as it comprises the feature of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:
   a first semiconductor region of a first conductivity type;
   a second semiconductor region of a second conductivity type provided on the first semiconductor region;
   a trench formed in the second semiconductor region;
   a thick gate insulating film selectively provided in a center area of a bottom surface of the trench;
   a thin gate insulating film provided along a periphery of the bottom surface and on a sidewall of the trench;
   a third semiconductor region of the first conductivity type that is selectively provided below the thin gate insulating film provided along the periphery of the bottom surface of the trench and that extends to the first semiconductor region;
   a fourth semiconductor region of the first conductivity type selectively provided in the surface of the second semiconductor region; and
   a gate electrode filling the trench via the gate insulating film.

2. A semiconductor device according to claim 1, wherein a lower surface of the second semiconductor region is formed generally at an identical level to or more deeply than the thin gate insulating film provided along the periphery of the bottom surface of the trench.

3. A semiconductor device according to claim 1, wherein the trench is formed shallower than a boundary surface between the first and second semiconductor regions.

4. A semiconductor device according to claim 1, wherein a portion directly under the thick gate insulating film is a semiconductor region of the first conductivity type.

5. A semiconductor device according to claim 4, wherein the semiconductor region of the first conductivity type has a higher impurity concentration than the first semiconductor region.

6. A semiconductor device according to claim 1, wherein a portion directly under the thick gate insulating film is a semiconductor region of the second conductivity type.

7. A semiconductor device according to claim 1, wherein the third semiconductor region has a higher impurity concentration than the first semiconductor region.

8. A semiconductor device according to claim 1, wherein the third semiconductor region has a higher impurity concentration than the second semiconductor region.

9. A semiconductor device according to claim 1, wherein a lower end of the third semiconductor region is generally at an identical level to a lower end of the thick gate insulating film or protrudes beyond it into the first semiconductor region.

10. A semiconductor device according to claim 1, wherein the third semiconductor region is formed in self alignment with the thick gate insulating film.

11. A semiconductor device according to claim 1, wherein the third semiconductor region is formed by doping impurities of the first conductivity type via the thin gate insulating film from above the trench.

12. A semiconductor device according to claim 1, wherein the first semiconductor region, the second semiconductor region, and the fourth semiconductor region form a drain, base, and source of a MOSFET, respectively.

* * * * *